United States Patent
Chaivipas

(10) Patent No.: US 9,548,727 B2
(45) Date of Patent: Jan. 17, 2017

(54) OSCILLATOR CIRCUIT

(71) Applicant: FUJITSU LIMITED, Kawasaki-shi, Kanagawa (JP)

(72) Inventor: Win Chaivipas, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/744,657

(22) Filed: Jun. 19, 2015

(65) Prior Publication Data
US 2015/0381153 A1   Dec. 31, 2015

(30) Foreign Application Priority Data
Jun. 30, 2014  (JP) .................. 2014-133634

(51) Int. Cl.
*H03K 3/03* (2006.01)
*H03L 7/099* (2006.01)

(52) U.S. Cl.
CPC ........... *H03K 3/0322* (2013.01); *H03K 3/0315* (2013.01); *H03L 7/0995* (2013.01)

(58) Field of Classification Search
CPC .... H03K 3/0315; H03K 3/0322; H03L 7/0995
USPC .................................................... 331/45, 57
See application file for complete search history.

(56) References Cited

U.S. PATENT DOCUMENTS

| 8,170,169 | B2* | 5/2012 | Martin | ............... | H03L 7/07 375/371 |
| 9,178,498 | B2* | 11/2015 | Chong | ............... | H03K 3/0322 |
| 2008/0088379 | A1* | 4/2008 | Chen | ............... | G05F 3/16 331/57 |
| 2008/0122546 | A1* | 5/2008 | Shiramizu | ............... | H03K 3/0322 331/34 |
| 2013/0120073 | A1 | 5/2013 | Okada et al. | | |

FOREIGN PATENT DOCUMENTS

| JP | 2011-61325 A | 3/2011 |
| JP | 2013-106062 A | 5/2013 |
| WO | WO 2010/108032 | * 9/2010 |

* cited by examiner

*Primary Examiner* — Richard Tan
(74) *Attorney, Agent, or Firm* — Arent Fox LLP

(57) ABSTRACT

An oscillator circuit includes: a plurality of delay elements, a first delay element configured to receive a first oscillator signal outputted from a second delay element in one stage before the first delay element and a second oscillator signal outputted from a third delay element in two or more stages before the first delay element, the plurality of delay terminals being connected in a ring by at least three or more delay elements, and the first oscillator signal and the second oscillator signal having phases different from one another; and a bias voltage generator configured to change a ratio of a first input bias current for the first oscillator signal to a second input bias current for the second oscillator signal, in accordance with a first bias voltage and a second bias voltage supplied to the plurality of delay elements.

3 Claims, 15 Drawing Sheets

OSCILLATOR CIRCUIT

CROSS-REFERENCE TO RELATED APPLICATION

This application is based upon and claims the benefit of priority of the prior Japanese Patent Application No. 2014-133634, filed on Jun. 30, 2014, the entire contents of which are incorporated herein by reference.

FIELD

The embodiments discussed herein are related to oscillator circuits.

BACKGROUND

In interface circuits that transmit and receive data between circuit boards and between large scale integrated circuits, multiple-phase clocks are used for sampling data at a plurality of timings.

For example, in high-speed signal transmission systems, optimum timings for sampling data vary depending on losses of received signals and the strength of equalization processing. Ideal timings for sampling received signals are a timing of the center of data (the center of an eye) at which the received signal has the largest amplitude and a timing at which data makes a transition. However, after equalization processing, the largest amplitude is not obtained at the center of data in some cases. To address this, there is a way in which, using a function called an eye monitor, the phases of clocks for data sampling are changed (generating multi-phase clocks) and thus an optimum sampling timing is determined.

One approach for generating multi-phase clocks is a method of using a phase interpolator. A phase interpolator, using an accurate reference clock, enables phase adjustment to be performed accurately. However, a clock source for generating an accurate reference clock is used, and thus the cost and the circuit size increase.

Another approach for generating multi-phase clocks is a method of using a ring oscillator, or an injection locked ring oscillator in which an additional feature for improving jitter characteristics of a ring oscillator is added.

Examples of the related art are disclosed in Japanese Laid-open Patent Publication No. 2011-61325 and Japanese Laid-open Patent Publication No. 2013-106062.

SUMMARY

According to an aspect of the invention, an oscillator circuit includes: a plurality of delay elements, a first delay element of the plurality of delay elements configured to receive a first oscillator signal outputted from a second delay element of the plurality of delay elements in one stage before the first delay element and a second oscillator signal outputted from a third delay element of the plurality of delay elements in two or more stages before the first delay element, the plurality of delay terminals being connected in a ring by at least three or more delay elements, and the first oscillator signal and the second oscillator signal having phases different from one another; and a bias voltage generator configured to change a ratio of a first input bias current for the first oscillator signal to a second input bias current for the second oscillator signal, in accordance with a first bias voltage and a second bias voltage supplied to the plurality of delay elements.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A ring oscillator and an injection locked ring oscillator may generate multiple-phase clocks, but may not adjust phases among signals.

Hereinafter, embodiments of an oscillator circuit capable of adjusting phases among signals will be described with reference to the accompanying drawings.

First Embodiment

Figure 1:
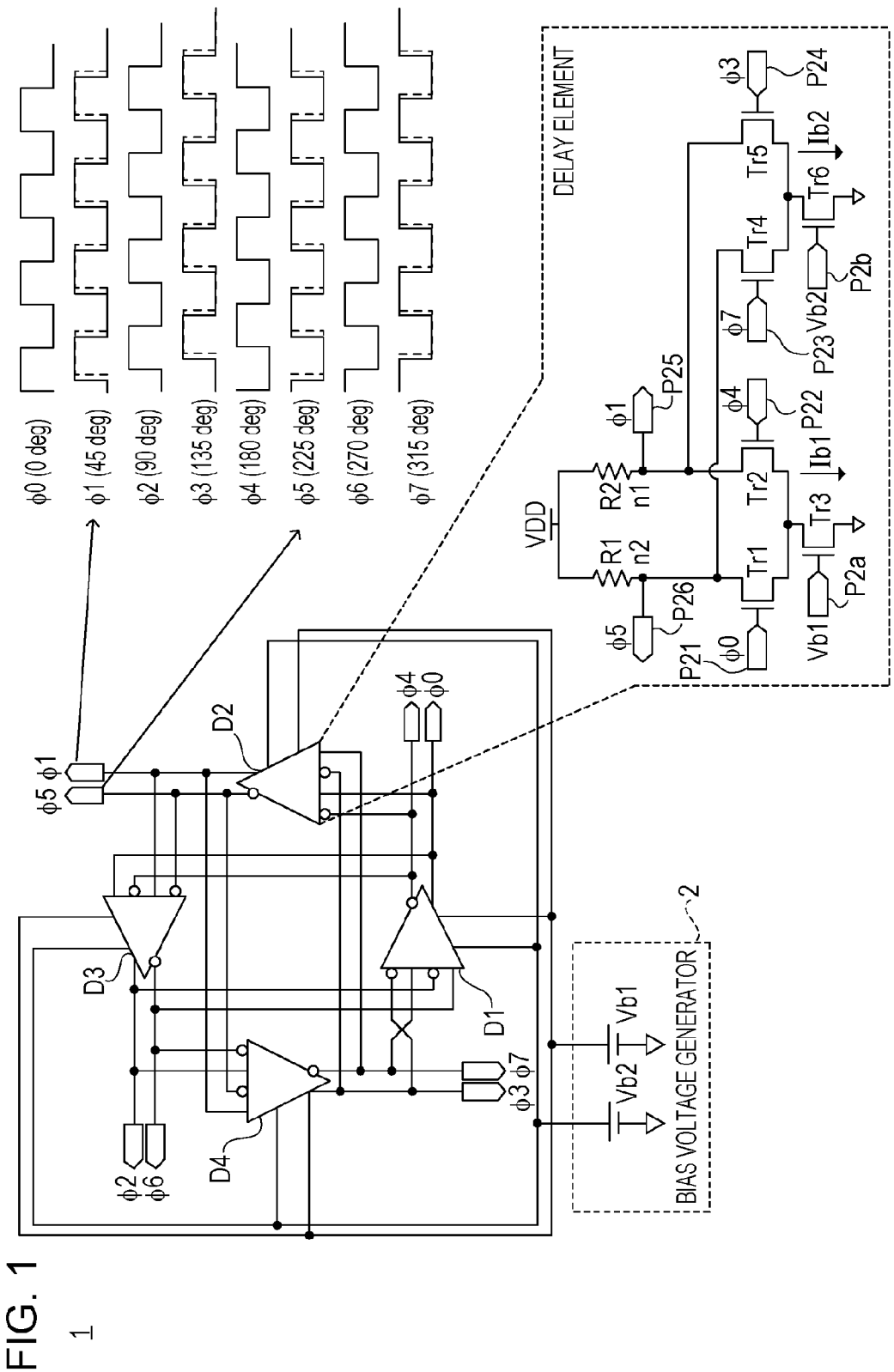
FIG. 1 illustrates an example of an oscillator circuit of a first embodiment.

FIG. 1 is a diagram illustrating an example of an oscillator circuit of a first embodiment. An oscillator circuit 1 of the first embodiment includes a plurality of delay elements D1, D2, D3, and D4 connected in a ring, and a bias voltage generator 2. The delay elements D1 to D4 are connected in three or more stages (four stages in the example of FIG. 1) in such a manner that an output terminal of one stage is connected to an input terminal of the subsequent stage. In the delay elements, an output terminal of the last stage is connected to an input terminal of the initial stage, and oscillator signals having phases different from one another are output.

Note that, in the example of FIG. 1, the delay elements D1 to D4 are elements that perform differential inputs and differential outputs, and each include positive-side and negative-side (non-inverting and inverting) input terminals and output terminals. A positive-side output terminal of the delay element D4 in the last stage is connected to a negative-side input terminal of the delay element D1 in the initial stage, and a negative-side output terminal of the delay element D4 is connected to a positive-side input terminal of the delay element D1. Thus, oscillation operations are performed even when the total number of the delay elements D1 to D4 is even.

The delay element D1 outputs oscillator signals $\phi 0$ and $\phi 4$, the delay element D2 outputs oscillator signals $\phi 1$ and $\phi 5$, the delay element D3 outputs oscillator signals $\phi 2$ and $\phi 6$, and the delay element D4 outputs oscillator signals $\phi 3$ and $\phi 7$. Note that two oscillator signals output from each of the delay elements D1 to D4 differ in phase by 180 degrees. This is due to the differential output.

The bias voltage generator 2 generates bias voltages to be supplied to the delay elements D1 to D4. In the example of FIG. 1, the bias voltage generator 2 supplies two different bias voltages Vb1 and Vb2 to each of the delay elements D1 to D4.

The bias voltage generator 2, in accordance with the bias voltages Vb1 and Vb2, changes the ratio in the delay element D2 of the input bias current for input from the delay element D1 to the input bias current for input from the delay element D4.

An exemplary circuit of the delay element D2 is illustrated in FIG. 1. This circuit is similar to the circuit of each of the delay elements D1, D3, and D4.

The delay element D2 includes transistors Tr1, Tr2, Tr3, Tr4, Tr5, and Tr6 and resistors R1 and R2. The transistors Tr1 to Tr6 are described as being n-channel metal-oxide semiconductor field effect transistors (MOSFETs) hereinafter, but may be p-channel MOSFETs.

A positive-side input terminal P21 is connected to the gate of the transistor Tr1 to which the oscillator signal $\phi 0$ output from the delay element D1, which is one stage before the delay element D2, is input. A negative-side input terminal P22 is connected to the gate of the transistor Tr2 to which the oscillator signal $\phi 4$ output from the delay element D1 is input. The sources of the transistors Tr1 and Tr2 are connected to the drain of the transistor Tr3. The source of the transistor Tr3 is grounded, a terminal P2a is connected to the gate of the transistor Tr3 to which the bias voltage Vb1 is applied. Additionally, the drain of the transistor Tr1 is connected to one end of the resistor R1, and the drain of the transistor Tr2 is connected to one end of the resistor R2. A power supply voltage VDD is applied to the other ends of the resistors R1 and R2.

Furthermore, in the delay element D2 of this embodiment, the drain of the transistor Tr4 is connected to the drain of the transistor Tr1, and the drain of the transistor Tr5 is connected to the drain of the transistor Tr2. A positive-side input terminal P23 is connected to the gate of the transistor Tr4 to which the oscillator signal $\phi 7$ output from the delay element D4, which is two stages before the delay element D2, is input; a negative-side input terminal P24 is connected to the gate of the transistor Tr5 to which the oscillator signal $\phi 3$ output from the delay element D4 is input. The sources of the transistors Tr4 and Tr5 are connected to the drain of the transistor Tr6. The source of the transistor Tr6 is grounded, and the terminal P2b is connected to the gate of the transistor Tr6 to which the bias voltage Vb2 is applied.

Note that a positive-side output terminal P25 is connected to a node n1 between the drain of the transistor Tr2 and one end of the resistor R2, and the oscillator signal $\phi 1$ of the delay element D2 is output from the output terminal P25. A positive-side output terminal P26 is connected to a node n2 between the drain of the transistor Tr1 and one end of the resistor R1, and the oscillator signal $\phi 5$ of the delay element D2 is output from the output terminal P26.

In such a manner, the oscillator signals $\phi 0$, $\phi 3$, $\phi 4$, and $\phi 7$ output from the delay element D1, which is one stage before the delay element D2, and the delay element D4, which is two stages before the delay element D2, are input to the delay element D2, and the delay element D2 receives the bias voltages Vb1 and Vb2. In accordance with the bias voltages Vb1 and Vb2, in the delay element D2, the ratio of the input bias currents for input from the delay element D1 and the delay element D4 (hereinafter referred to simply as bias currents) Ib1 and Ib2 are changed, and thus the amount of delay is changed.

The oscillator signals $\phi 3$ and $\phi 7$ output from the delay element D4 vary earlier (leading in phase) than the oscillator signals $\phi 0$ and $\phi 4$ output from the delay element D1. When the bias voltage Vb2 is larger than the bias voltage Vb1, the bias current Ib2 is larger than the bias current Ib1. This strengthens the influences of the oscillator signals $\phi 3$ and $\phi 7$, which vary earlier, to decrease the amount of delay of the entire delay element D4.

In contrast, when the bias voltage Vb2 is smaller than the bias voltage Vb1, the bias current Ib1 is larger than the bias current Ib2. This strengthens the influences of the oscillator signals $\phi 0$ and $\phi 4$, which vary later, to increase the amount of delay of the entire delay element D4.

In this way, adjusting the ratio of the bias currents Ib1 and Ib2 (the relationship between the magnitudes of both the currents) may change the amount of delay, and therefore the phases of the oscillator signals $\phi 1$ and $\phi 5$ may be adjusted.

Exemplary states of the oscillator signals (an example of clock signals being illustrated) $\phi 0$ to $\phi 7$ are illustrated in FIG. 1. An example of the phases of the oscillator signals $\phi 1$ to $\phi 7$ under the assumption that the oscillator signal $\phi 0$ output from the delay element D1 has a phase of zero degrees is illustrated along with the states. In FIG. 1, examples in which the phases of the oscillator signals $\phi 1$, $\phi 3$, $\phi 5$, and $\phi 7$ are shifted relative to the phases of the oscillator signals $\phi 0$, $\phi 2$, $\phi 4$, and $\phi 6$ are indicated by dotted lines.

In order to realize such phase shifts, in the delay elements D2 and D4, the input biases for input from the delay elements D1 and D3, which are one stages before the delay elements D2 and D4, are set to the bias voltage Vb1, respectively, and the input biases for input from the delay elements D4 and D2, which are two stages before the delay elements D2 and D4, are set to the bias voltage Vb2, respectively. In the delay elements D1 and D3, the input biases for input from the delay elements D4 and D2, which are one stages before the delay elements D1 and D3, are set to the bias voltage Vb2, respectively, and the input biases for input from the delay elements D3 and D1, which are two stages before the delay elements D1 and D3, are set to the bias voltage Vb1, respectively. In this way, bias voltages for inputs are reversed between the delay elements in the odd-numbered stages and those in the even-numbered stages (the relationship between the magnitudes of bias currents is also reversed), so that the phase intervals of oscillator signals output from the even-numbered delay elements are different from those of oscillator signals output from the odd-numbered delay elements.

Although, in the example of FIG. 1, in each of the delay elements D1 to D4, oscillator signals output from a delay element one stage before the delay element in question and a delay element two stages before the delay element in question are input, and two different bias voltages are received, the way in which oscillator signals are input and bias voltages are received is not limited to this. For example, one delay element may receive two different voltages and the other delay elements may receive the same bias voltage. Additionally, the amount of delay may be adjusted by inputting, to each delay element, oscillator signals output from a delay element one stage before the delay element in question and a plurality of delay elements, which are in stages three or more stages before the stage of the delay element in question, and changing the ratio of bias currents of each input using a plurality of different bias voltages.

Figure 2:
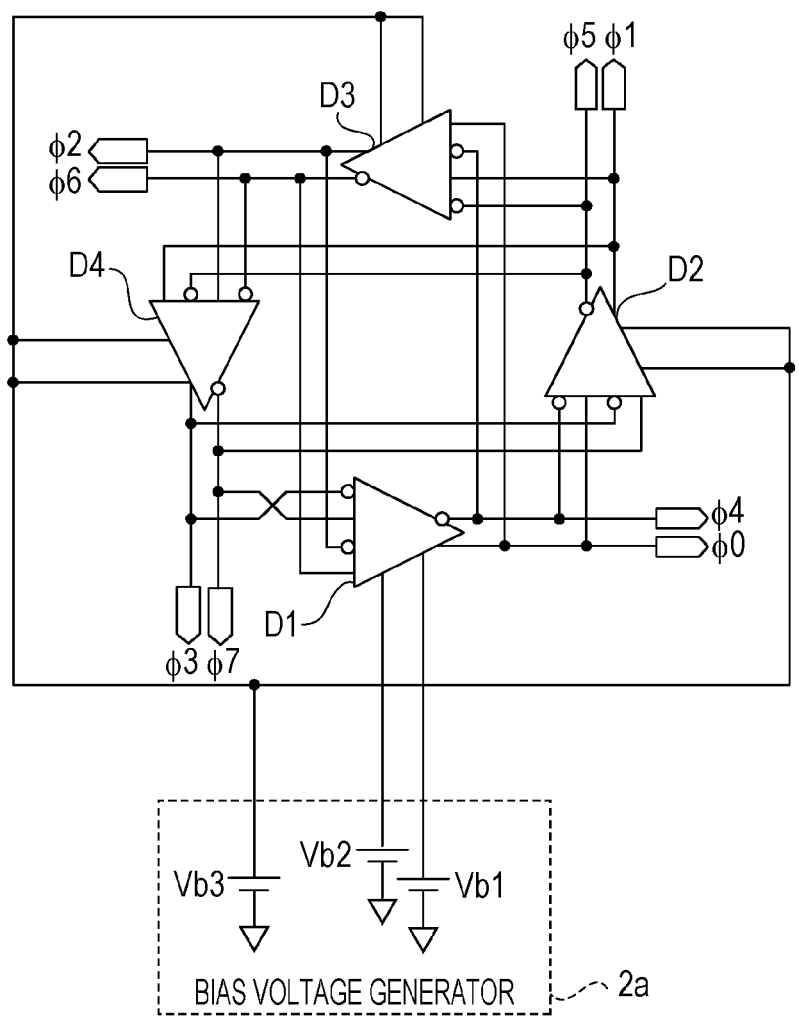
FIG. 2 is a diagram illustrating a modification of the oscillator circuit of the first embodiment.

FIG. 2 is a diagram illustrating a modification of the oscillator circuit of the first embodiment. Elements the same as those of the oscillator circuit 1 illustrated in FIG. 1 are denoted by the same reference characters. An oscillator circuit is illustrated in FIG. 2 differs from the oscillator circuit 1 illustrated in FIG. 1 in that the two different bias voltages Vb1 and Vb2 are applied to the delay element D1 by a bias voltage generator 2a and the same bias voltage Vb3 is applied to the other delay elements D2 to D4.

Figure 3:
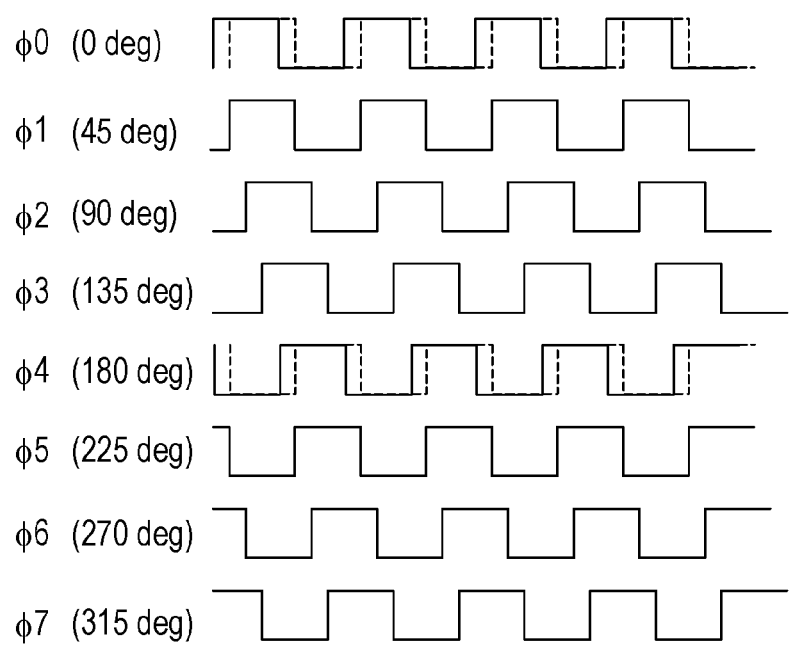
FIG. 3 is a diagram illustrating exemplary states of oscillator signals output from the oscillator circuit illustrated in FIG. 2.

FIG. 3 is a diagram illustrating exemplary states of oscillator signals output from the oscillator circuit illustrated in FIG. 2. Exemplary states of the oscillator signals $\phi 0$ to $\phi 7$ output from the delay elements D1 to D4 are illustrated. As indicated by dotted lines in FIG. 3, the phases of the oscillator signals $\phi 0$ and $\phi 4$ output from the delay element D1 to which the two different bias voltages Vb1 and Vb2 are applied are shifted relative to those of the oscillator signals $\phi 1$ to $\phi 3$ and $\phi 5$ to $\phi 7$ output from the other delay elements D2 to D4.

In such a manner, oscillator signals of the delay elements D4 and D3, which are one and two stages before the delay elements D1, respectively, are input to the delay element D1, and the ratio of bias currents for inputs is changed using the bias voltages Vb1 and Vb2, and thus the amount of delay is changed, so that the phases of the oscillator signals $\phi 0$ and $\phi 4$ of the delay element D1 may be adjusted.

Note that if the same bias voltage, instead of the two different bias voltages Vb1 and Vb2, is applied to all the delay elements D1 to D4, the phases are fixed, and thus a ring oscillator may be implemented.

Figure 4:
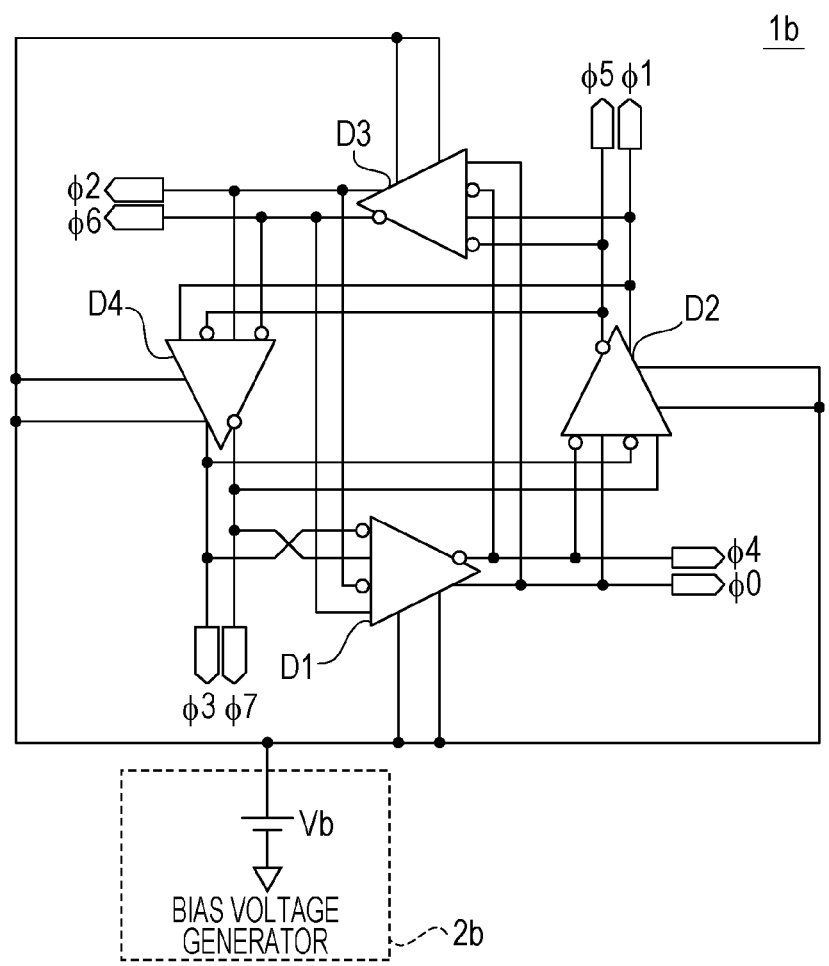
FIG. 4 is a diagram illustrating an example of an oscillator circuit that functions as a ring oscillator.

FIG. 4 is a diagram illustrating an example of an oscillator circuit that functions as a ring oscillator. Elements the same as those of the oscillator circuit 1 illustrated in FIG. 1 are denoted by the same reference characters. An oscillator circuit 1b illustrated in FIG. 4 differs from the oscillator circuit 1 illustrated in FIG. 1 in that a bias voltage generator 2b applies the same bias voltage Vb to all the delay elements D1 to D4. That is, the same bias voltage Vb is applied to the gates of the transistors Tr3 and Tr6 illustrated in FIG. 1.

Thus, the phase intervals of each of the oscillator signals $\phi 0$ to $\phi 7$ output from all the delay elements D1 to D4 are fixed. For this reason, the oscillator circuit 1b functions as a ring oscillator that outputs oscillator signals $\phi 0$ to $\phi 7$ of eight kinds of phases, 0 degrees, 45 degrees, 90 degrees, 135 degrees, 180 degrees, 225 degrees, 270 degrees, and 315 degrees.

Second Embodiment

Figure 5:
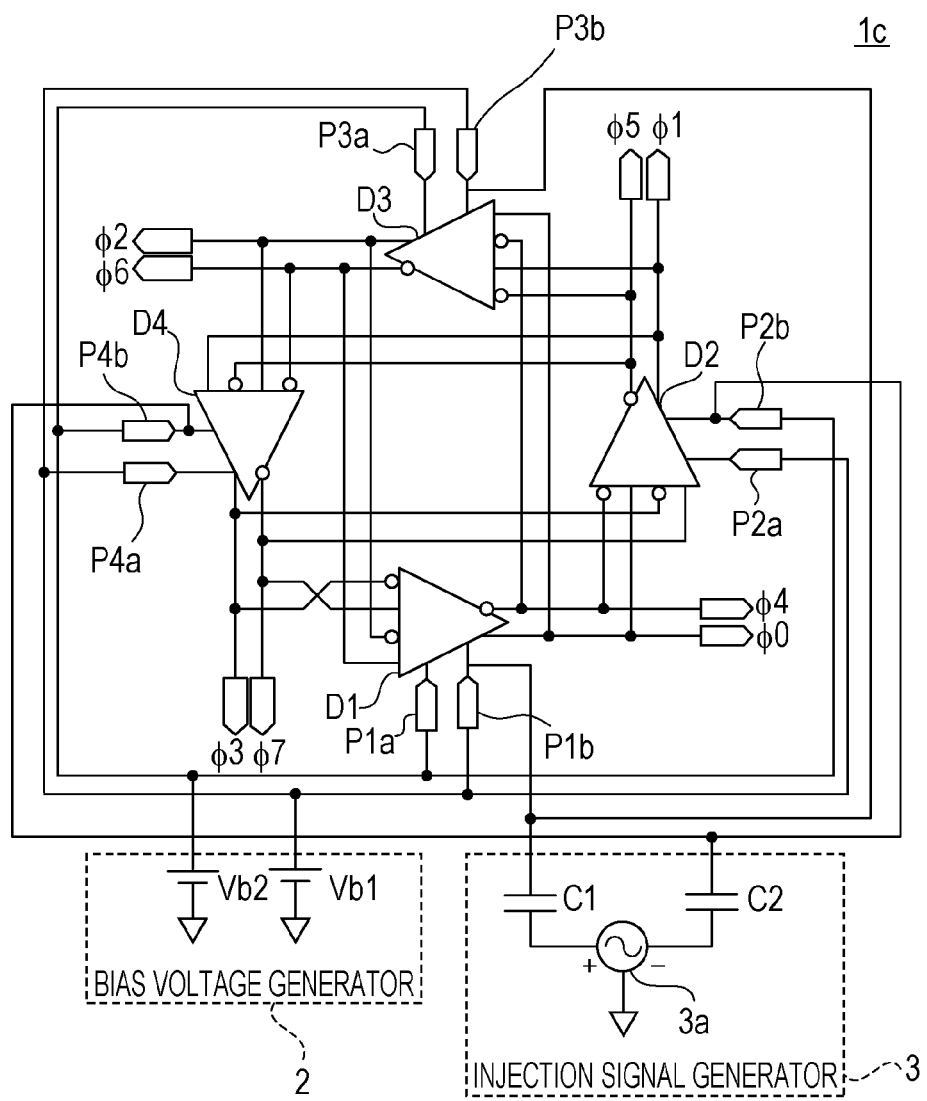
FIG. 5 illustrates an example of an oscillator circuit of a second embodiment.

FIG. 5 is a diagram illustrating an example of an oscillator circuit of a second embodiment. Elements the same as those of the oscillator circuit 1 illustrated in FIG. 1 are denoted by the same reference characters. An oscillator circuit is illustrated in FIG. 5 is an oscillator circuit that performs injection locking, and includes an injection signal generator 3 that generates injection signals.

The injection signal generator 3 includes capacitors C1 and C2 and an alternating current (AC) signal source 3a. The AC signal source 3a is connected at the plus side to one terminal of the capacitor C1, and is connected at the minus side to one terminal of the capacitor C2. The AC signal source 3a is grounded. The other terminal of the capacitor C1 is connected to the delay elements D1 and D3, and the other end of the capacitor C2 is connected to the delay elements D2 and D4. The frequency of an injection signal is, for example, set to be twice the self-oscillation frequency of the oscillator circuit 1c.

In the example of FIG. 5, in the delay elements D1 to D4, terminals P1a, P1b, P2a, P2b, P3a, P3b, P4a, and P4b to which the bias voltages Vb1 and Vb2 are applied are illustrated. The terminals P1a, P2a, P3a, and P4a are terminals to each of which a bias voltage for input from a delay element one stage before the delay element in question is applied. The terminals P1b, P2b, P3b, and P4b are terminals to each of which a bias voltage for input from a delay element two stages before the delay element in question is applied.

It is desirable that injection signals be input to the side of the latter terminals, the terminals P1b, P2b, P3b, and P4b. The reason is as follows.

Figure 6:
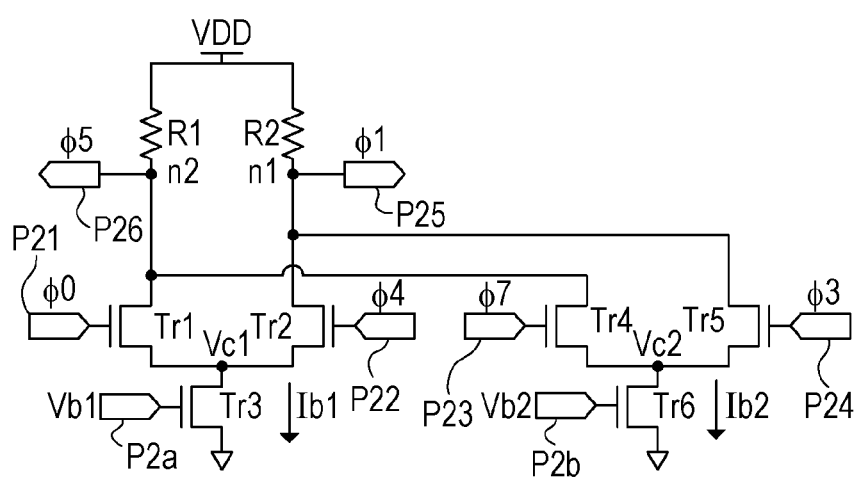
FIG. 6 is a diagram illustrating an example of a delay element.

FIG. 6 is a diagram illustrating an example of a delay element. FIG. 6 illustrates an example of the delay element D2 illustrated in FIG. 1 once more. Here, the bias voltage Vb1 for input from the delay element D1, which is one stage before the delay element D2, is applied to the terminal P2a, and the bias voltage Vb2 for input from the delay element D4, which is two stages before the delay element D2, is applied to the terminal P2b.

Figure 7:
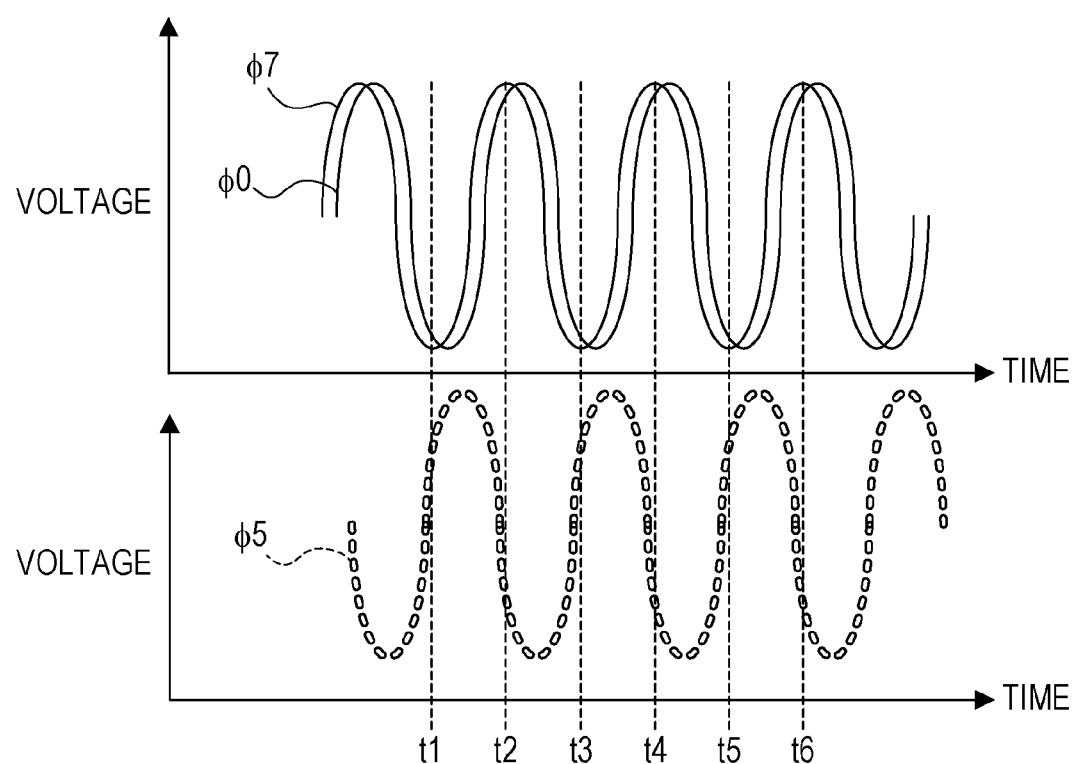
FIG. 7 is a diagram illustrating an example of two oscillator signals input to a delay element and an oscillator signal output from the delay element.
Figure 8:
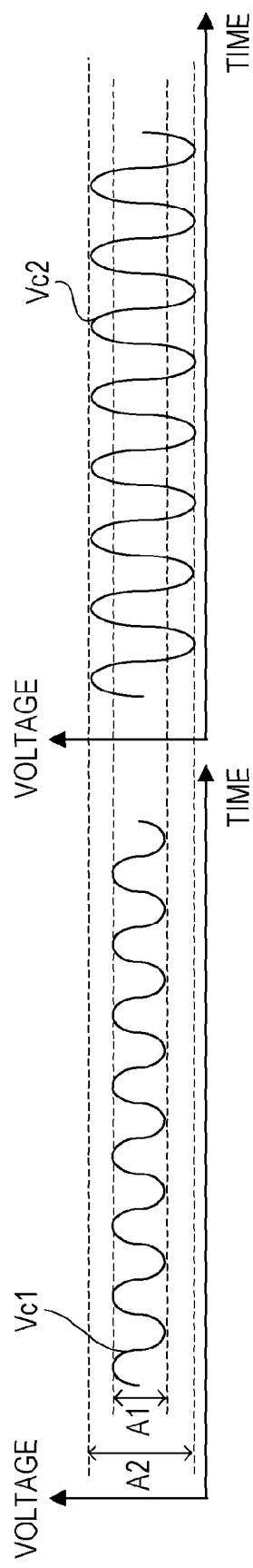
FIG. 8 is a diagram illustrating an example of voltages of the drains of two transistors in which bias voltages are applied to the gates, in the delay element.

FIG. 7 is a diagram illustrating an example of two oscillator signals input to a delay element and an oscillator signal output from the delay element. FIG. 8 is a diagram illustrating an example of voltages of the drains of two transistors in which bias voltages are applied to the gates, in a delay element. The horizontal axis represents time and the vertical axis represents the voltage.

In FIG. 7, exemplary states of the oscillator signals $\phi 0$ and $\phi 7$ input to the delay element D2 and the oscillator signal $\phi 5$ output from the delay element D2 are illustrated. As illustrated in FIG. 7, the oscillator signal $\phi 0$ output from the delay element D1 is behind the oscillator signal $\phi 7$ output from the delay element D4 in phase by 45 degrees. Because of this phase difference, the voltage of the oscillator signal $\phi 7$ is higher than the voltage of the oscillator signal $\phi 0$ in ranges from a time t1 to a time t2, from a time t3 to a time t4, and from a time t5 to a time t6. In the ranges, the voltage of the oscillator signal $\phi 5$ is high.

For this reason, as illustrated in FIG. 8, in the delay element D2, an amplitude A2 of a voltage Vc2 on the drain side of the transistor Tr6 is larger than an amplitude A1 of a voltage Vc1 on the drain side of the transistor Tr3. Consequently, a larger current flows and the sensitivity to an injection signal is higher on the side of the transistor Tr6 than on the side of the transistor Tr3. The higher the sensitivity to an injection signal, the more the oscillation frequency of the oscillator circuit 1c is likely to be in synchronization with the frequency of the injection signal even though the difference between these frequencies is large.

Consequently, regarding injection signals, it is desirable that an injection signal be input to the side on which the oscillator signals φ7 and φ3, which lead in phase, are input, that is, the side of the terminal P2b in the delay element D2. This applies to other delay elements D1, D3, and D4.

Note that an injection signal may be input to a terminal provided separately from the terminal P2b to which the bias voltage Vb2 is applied.

With the oscillator circuit 1c as described above, advantages similar to those with the oscillator circuit 1 of the first embodiment are obtained, and since injection locking operations are implemented using injection signals, occurrence of jitter and phase noise may be suppressed.

Other Examples of Delay Element

The delay elements D1 to D4 are not limited to those illustrated in FIG. 6. For example, circuits as described below may be employed.

Figure 9:
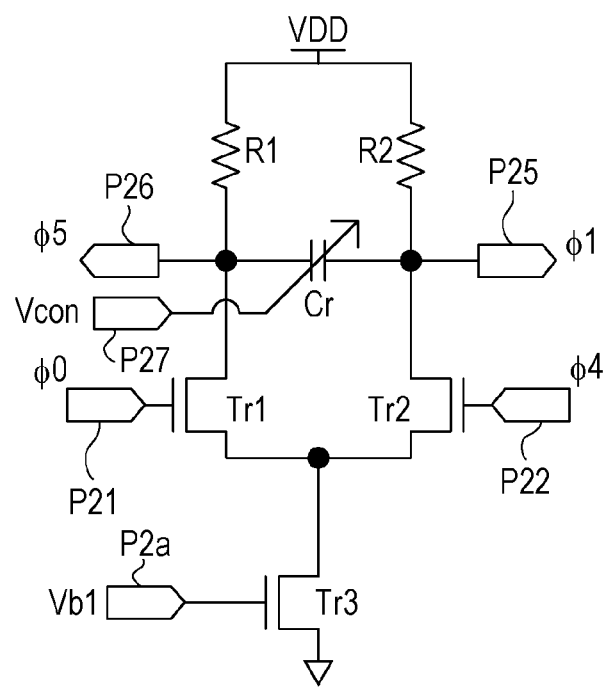
FIG. 9 is a diagram illustrating a first modification of the delay element.

FIG. 9 is a diagram illustrating a first modification of the delay element. Elements the same as those of the delay element D2 illustrated in FIG. 6 are denoted by the same reference characters. The transistors Tr4 to Tr6 of the delay element D2 are not illustrated in the drawing.

In a delay element D2a illustrated in FIG. 9, a variable capacitor Cr is connected between the transistors Tr1 and Tr2. In the variable capacitor Cr, the capacitance value is controlled by a control voltage Vcon applied from a controller, which is not illustrated in the drawing, through the terminal P27.

Using such the delay element D2 enables the amount of delay in the delay element D2a to be controlled in two ways: using the bias voltage Vb1 (and the bias voltage Vb2 not illustrated) and using the variable capacitor Cr. For this reason, the range in which the phase may be adjusted extends.

Figure 10:
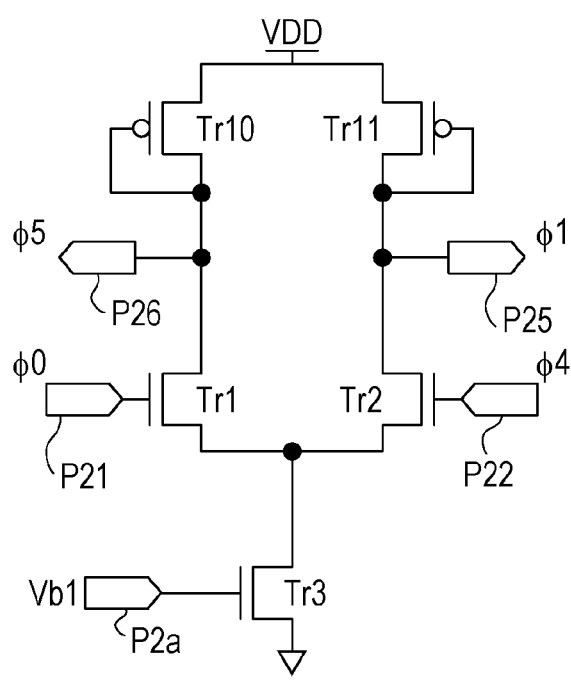
FIG. 10 is a diagram illustrating a second modification of the delay element.

FIG. 10 is a diagram illustrating a second modification of the delay element. Elements the same as those of the delay element D2 illustrated in FIG. 6 are denoted by the same reference characters. The transistors Tr4 to Tr6 of the delay element D2 are not illustrated in the drawing.

In a delay element D2b illustrated in FIG. 10, transistors Tr10 and Tr11, which are p-channel MOSFETs, are used instead of the resistors R1 and R2 of the delay element D2 illustrated in FIG. 6.

The drain of the transistor Tr10 is connected to the drain of the transistor Tr1 and is connected to the gate of the transistor Tr10. The drain of the transistor Tr11 is connected to the drain of the transistor Tr2 and is connected to the gate of the transistor Tr11. That is, the transistors Tr10 and Tr11 are diode connected. The power supply voltage VDD is applied to the sources of the transistors Tr10 and Tr11.

Using such the delay element D2b avoids using the resistors R1 and R2. This may reduce the circuit area. Process variations in resistance may be suppressed more in the case where the transistors Tr10 and Tr11 are used than in the case where the resistors R1 and R2 are used, and thus phase adjustment with more accuracy is enabled.

Figure 11:
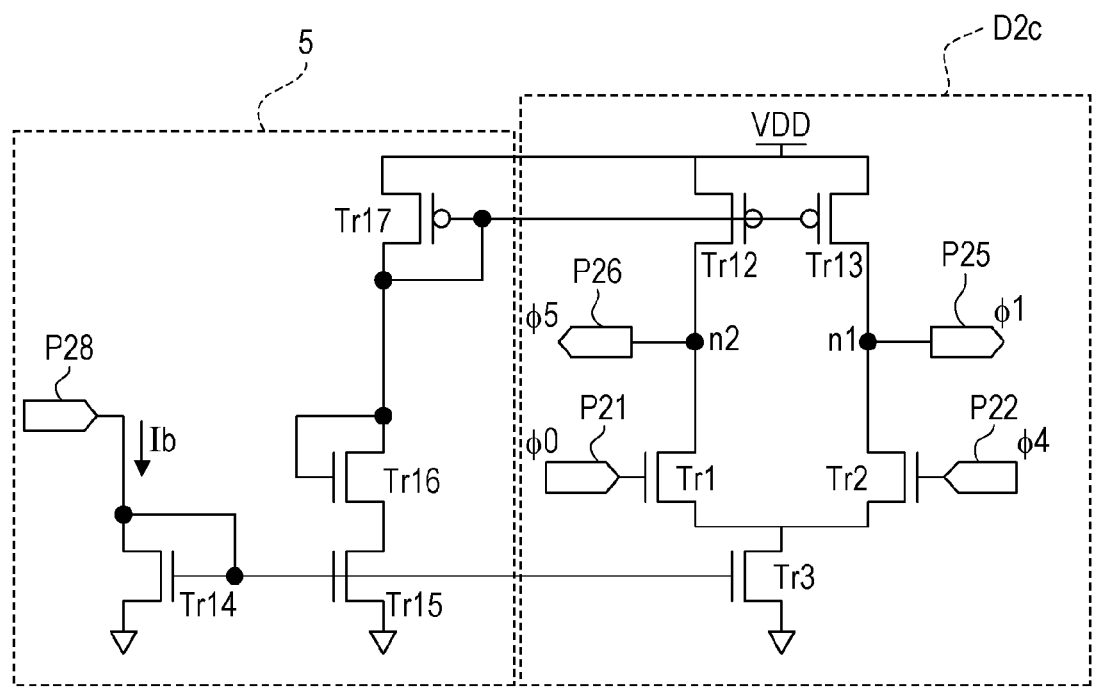
FIG. 11 is a diagram illustrating a third modification of the delay element.

FIG. 11 is a diagram illustrating a third modification of the delay element. Elements the same as those of the delay element D2 illustrated in FIG. 6 are denoted by the same reference characters. The transistors Tr4 to Tr6 of the delay element D2 are not illustrated in the drawing.

In a delay element D2c illustrated in FIG. 11, likewise in the delay element D2b illustrated in FIG. 10, transistors Tr12 and Tr13, which are p-channel MOSFETs, are used instead of the resistors R1 and R2 of the delay element D2 illustrated in FIG. 6.

The drain of the transistor Tr12 is connected to the drain of the transistor Tr1, and the drain of the transistor Tr13 is connected to the drain of the transistor Tr2. The power supply voltage VDD is applied to the sources of the transistors Tr12 and Tr13. Incidentally, unlike the delay element D2b illustrated in FIG. 10, the gates of the transistors Tr12 and Tr13 are driven by another circuit 5.

The circuit 5 includes transistors Tr14, Tr15, Tr16, and Tr17. The transistors Tr14, Tr15, and Tr16 are n-channel MOSFETs and the transistor Tr17 is a p-channel MOSFET.

A bias current is input through a terminal P28 to the drain of the transistor Tr14, and the source thereof is grounded. The gate of the transistor Tr14 is connected to the drain thereof, the gate of the transistor Tr15, and the gate of the transistor Tr3 of the delay element D2c. That is, the gate voltage of the transistor Tr14 is applied as a bias voltage to the gate of the transistor Tr3. Note that two bias voltages are applied to the delay element D2c, and therefore a portion for supplying the other bias voltage is provided in the circuit 5 although the portion is not illustrated in the drawing.

The source of the transistor Tr15 is grounded, and the drain thereof is connected to the source of the transistor Tr16. The drain of the transistor Tr16 is connected to the drain of the transistor Tr17 and the gate of the transistor Tr16. The gate of the transistor Tr17 is connected to the gates of the transistors Tr12 and Tr13 of the delay element D2c and is connected to the drain of the transistor Tr17. The power supply voltage VDD is applied to the source of the transistor Tr17.

In such the delay element D2c, since the gates of the transistors Tr12 and Tr13 are driven by the other circuit 5, the load connected to the output terminals P25 and P26 is decreased. For this reason, the operation speed may be made higher than in the case where the transistors Tr10 and Tr11 are used in a diode-connected configuration as in the delay element D2b as illustrated in FIG. 10.

Figure 12:
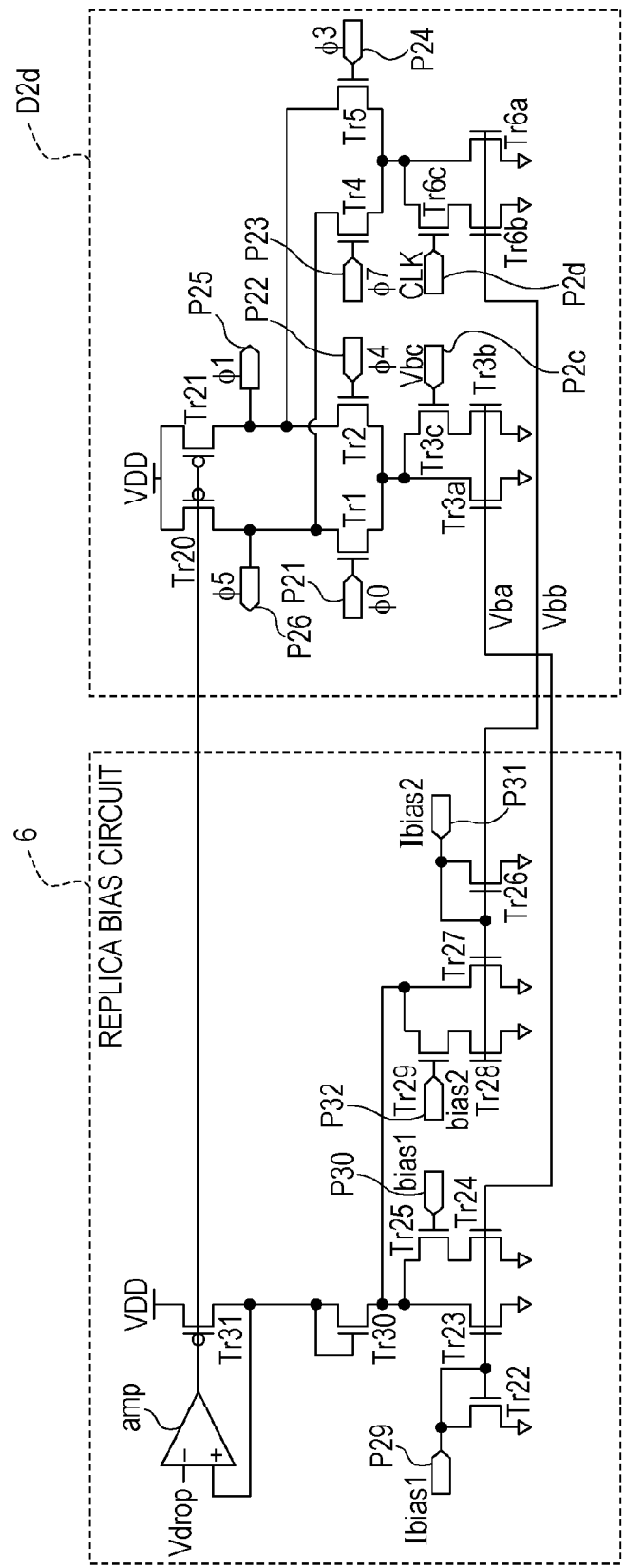
FIG. 12 is a diagram illustrating a fourth modification of the delay element.

FIG. 12 is a diagram illustrating a fourth modification of the delay element. Elements the same as those of the delay element D2 illustrated in FIG. 6 are denoted by the same reference characters. Note that, in a delay element D2d illustrated in FIG. 12, a transistor (n-channel MOSFET) to which an injection signal is input and those to which bias voltages are input are separated. That is, the delay element D2d includes transistors Tr3a and Tr3b and transistors Tr6a and Tr6b. A bias voltage Vba is applied to the gates of the transistors Tr3a and Tr3b, and a bias voltage Vbb is applied to the gates of the transistors Tr6a and Tr6b. The delay element D2d further includes a transistor Tr3c and a transistor Tr6c. A bias voltage Vbc is applied through a terminal P2c to the gate of the transistor Tr3c, and an injection signal CLK is input through a terminal P2d to the gate of the transistor Tr6c.

The drains of the transistors Tr3a and Tr3c are connected to the sources of the transistors Tr1 and Tr2, and the source of the transistor Tr3c is connected to the drain of the transistor Tr3b. The sources of the transistors Tr3a and Tr3b are grounded. The drains of the transistors Tr6a and Tr6c are connected to the sources of the transistors Tr4 and Tr5, and the source of the transistor Tr6c is connected to the drain of the transistor Tr6b. The sources of the transistors Tr6a and Tr6b are grounded.

Additionally, in the delay element D2d, likewise in the delay element D2c illustrated in FIG. 11, transistors Tr20 and Tr21, which are p-channel MOSFETs, are used instead of the resistors R1 and R2 of the delay element D2 illustrated in FIG. 6.

In such the delay element D2d, a gate voltage for driving the transistors Tr20 and Tr21 and the bias voltages Vba and Vbb are generated in a replica bias circuit 6.

The replica bias circuit 6 includes transistors Tr22 to Tr31 and an operational amplifier amp. The drain of the transistor Tr22 is connected to the gate thereof, and the gates of the transistors Tr23 and Tr24 and the transistors Tr3a and Tr3b of the delay element D2d. A bias current Ibias1 is input through a terminal P29 to the drain of the transistor Tr22. The sources of the transistors Tr22 to Tr24 are grounded. The drains of the transistor Tr23 and a transistor Tr25 are connected to the source of a transistor Tr30. The source of the transistor Tr25 is connected to the drain of the transistor Tr24. The bias voltage bias1 is applied to a terminal P30 connected to the gate of the transistor Tr25.

The drain of the transistor Tr26 is connected to the gate thereof, and the gates of the transistors Tr27 and Tr28 and the transistors Tr6a and Tr6b of the delay element D2d. A bias current Ibias2 is input through a terminal P31 to the drain of the transistor Tr26. The sources of the transistors Tr26 to Tr28 are grounded. The drains of the transistor Tr27 and a transistor Tr29 are connected to the source of the transistor Tr30. The source of the transistor Tr29 is connected to the drain of the transistor Tr28. A bias voltage bias2 is applied to a terminal P32 connected to the gate of the transistor Tr29.

The drain of the transistor Tr30 is connected to the gate thereof, the drain of the transistor Tr31, and a non-inverting input terminal of the operational amplifier amp. The gate of the transistor Tr31 is connected to the gates of the transistors Tr20 and Tr21 of the delay element D2d and to an output terminal of the operational amplifier amp. The power supply voltage VDD is applied to the source of the transistor Tr31.

A voltage Vdrop is applied to an inverting input terminal of the operational amplifier amp. As the voltage Vdrop, a voltage generated by a voltage generator, which is not illustrated in the drawing, in the replica bias circuit 6, for example, is used.

Note that the bias currents Ibias1 and Ibias2, the bias voltages bias1 and bias2, and the bias voltage Vbc of the delay element D2d are supplied from a bias generator, which is not illustrated in the drawing.

The oscillator signals φ0, φ4, φ3 and φ7 of a delay element, which are one and second stages before the delay element D2d, are input to the delay element D2d described above. In the delay element D2d, the ratio of bias currents for inputs is changed in accordance with the bias voltages Vba and Vbb, and thus the amount of delay is changed, so that the phases of the oscillator signals φ1 and φ5 are adjusted.

Operations of the replica bias circuit 6 will be described below. For purposes of simplification of explanation, the transistor size that is determined by the gate width (W) and the gate length (L) is given as follows.

The size of the transistor Tr20, Tr21 is equal to the size of the transistor Tr31. The size of the transistor Tr1, Tr2, Tr4, Tr5 is 0.5 times the size of the transistor Tr30. The size of the transistor Tr3c, Tr6c is twice the size of the transistor Tr25, Tr29. The size of the transistor Tr3a, Tr3b, Tr6a, Tr6b is twice the size of the transistor Tr23, Tr24, Tr27, Tr28 and four times the size of the transistor Tr22, Tr26.

The bias currents Ibias1 and Ibias2 determine bias currents for inputs in the delay element D2d and the ratios thereof. When the transistor sizes have the above relationship, the bias current Ibias1, Ibias2 is one fourth of a bias current flowing through the transistors Tr3a, Tr3b, Tr6a, and Tr6b.

Owing to a current mirror function in accordance with the above transistor size example, a current that is twice the bias current Ibias1 flows into the drains of the transistors Tr23 and Tr25, and a current that is twice the bias current Ibias2 flows into the drains of the transistors Tr27 and Tr29. Consequently, a current obtained by adding up these currents flows into the source of the transistor Tr30. In the replica bias circuit 6, the output common level of the delay element D2d (the common level of the oscillator signals φ1 and φ5) is determined by the drain-source current of the transistor Tr30.

The ratio of the bias current Ibias1 to the bias current Ibias2 is x: 1−x (0<x<1). Therefore, if this ratio changes, the entire bias level will not change. However, if the entire current amount changes, the operational amplifier amp automatically adjusts the gate voltages of the transistors Tr20, Tr21, and Tr31 so as to cause the drain voltage of the transistor Tr31 to be equal to the voltage Vdrop. Since a current flowing through the transistors Tr20 and Tr21 is the same as a current flowing through the transistor Tr31, the drain voltage of the transistor Tr31 and the output common level of the delay element D2d are the same.

Using such the replica bias circuit 6 enables the output common level to be maintained at the voltage Vdrop even when the total amount of the two bias currents of the delay element D2d is changed and thus the total current amount of the entire replica bias circuit 6 is changed. For this reason, occurrence of a situation in which changing the output common level leads to the fact that the oscillator circuit does not operate may be suppressed.

Additionally, the transistors Tr20 and Tr21 become capable of operating not only in the saturation region but also in the linear region. A higher operating frequency than in the delay elements D2b and D2c illustrated in FIG. 10 and FIG. 11 may be achieved, and smaller-sized transistors Tr20 and Tr21 than in the delay elements D2b and D2c may be used. Additionally, the function of maintaining the output common level of the replica bias circuit 6 strengthen the resistance to process variations.

Note that, in order to decrease the bias current, the above ratios of the transistor sizes may be changed. For example, the entire transistor size except for the transistors Tr22 and Tr26 may be halved.

Third Embodiment

An oscillator circuit using the delay element D2d and the replica bias circuit 6 illustrated in FIG. 12 will be described below as an oscillator circuit of a third embodiment.

Figure 13:
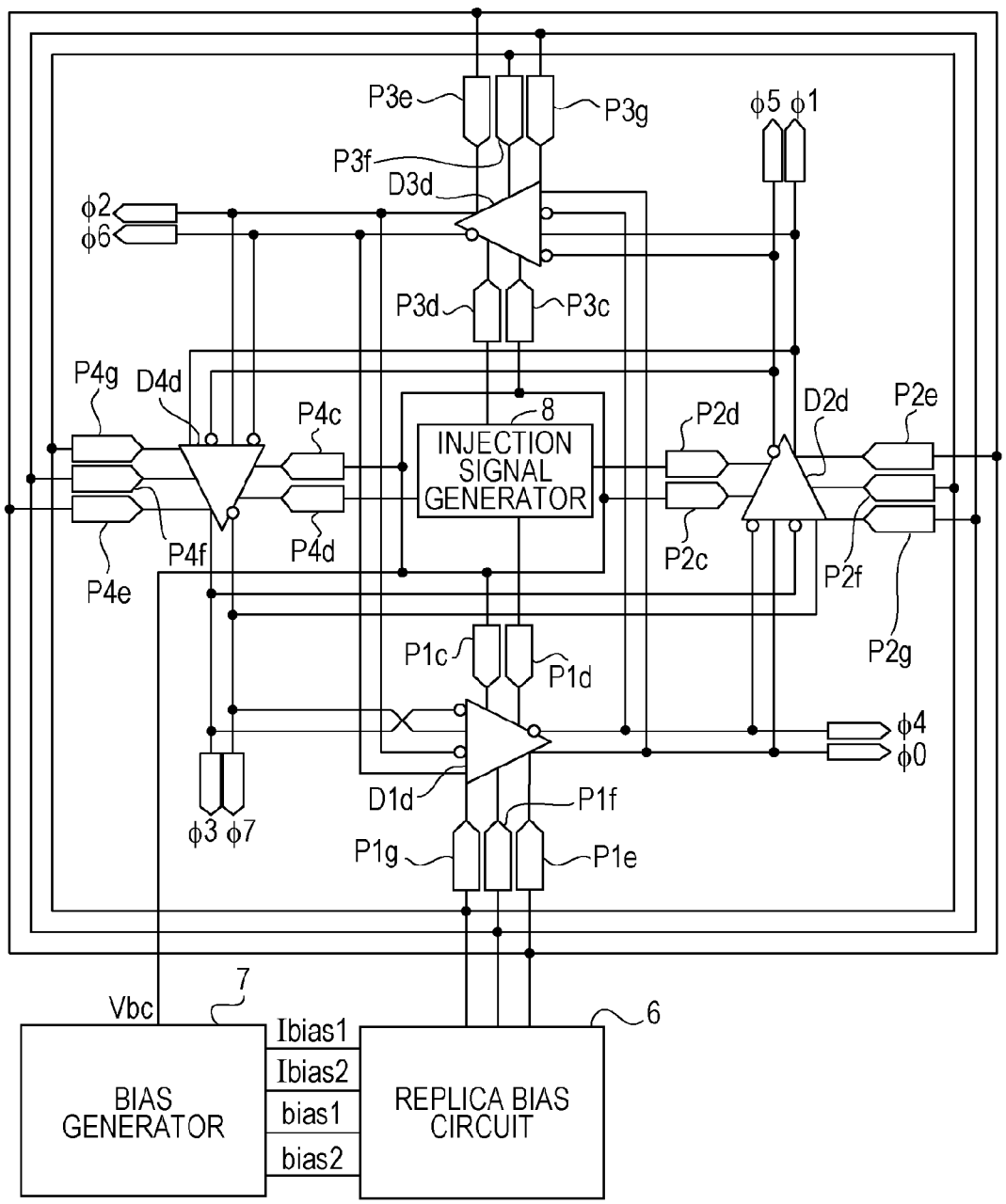
FIG. 13 is a diagram illustrating an example of an oscillator circuit of a third embodiment.

FIG. 13 is a diagram illustrating an example of an oscillator circuit of a third embodiment. An oscillator circuit 1d of the third embodiment, like the oscillator circuit 1c illustrated in FIG. 5, is an oscillator circuit that performs injection locking; however, delay elements D1d to D4d, which are similar to the delay element D2d illustrated in FIG. 12 in terms of circuitry, are used instead of the delay elements D1 to D4. The oscillator circuit 1d further includes the replica bias circuit 6, a bias generator 7, and an injection signal generator 8.

The replica bias circuit 6, being the same as that illustrated in FIG. 12, is denoted by the same reference number. The bias generator 7 generates the bias currents Ibias1 and Ibias2 and the bias voltages bias1 and bias2 to be supplied to the replica bias circuit 6. The bias generator 7 also generates a bias voltage (the bias voltage Vbc illustrated in FIG. 12) to be supplied to the delay elements D1d to D4d.

The injection signal generator 8 generates injection signals (the injection signal CLK illustrated in FIG. 12) to be supplied to the delay elements D1d to D4d. The injection signal is, for example, a two-phase clock signal.

In the oscillator circuit 1d, for example, in the delay elements D2d and D4d, input biases for input from the delay elements D1d and D3d, which are one stages before the delay elements D2d and D4d, respectively, are set to be the bias voltage Vba generated in the replica bias circuit 6, respectively. In the delay elements D2d and D4d, input biases for input from the delay elements D4d and D2d, which are two stages before the delay elements D2d and D4d, respectively, are set to be the bias voltage Vbb generated in the replica bias circuit 6. In the delay elements D1d and D3d, the input biases for input from the delay elements D4d and D2d, which are one stages before the delay elements D1d and D3d, respectively, are set to be the bias voltage Vbb, and the input biases for input from the delay elements D3d and D1d, which are two stages before the delay elements D1d and D3d, respectively, are set to be the bias voltage Vba, respectively.

In this way, bias voltages for inputs are reversed between the delay elements in the odd-numbered stages and those in the even-numbered stages, so that, as illustrated in FIG. 1, the phase intervals of oscillator signals output from the even-numbered delay elements are different from those of oscillator signals output from the odd-numbered delay elements.

The bias voltage Vba is applied to terminals P1f, P2g, P3g, and P4f of the delay elements D1d to D4d, and the bias voltage Vbb is applied to terminals P1g, P2f, P3f, and P4g of the delay elements D1d to D4d.

The output terminal of the operational amplifier amp and the gate of the transistor Tr31 in the replica bias circuit 6 are connected to terminals P1e, P2e, P3e, and P4e of the delay elements D1d to D4d. The terminal P2e is a terminal connected to the gates of the transistors Tr20 and Tr21 of the delay element D2d illustrated in FIG. 12.

Injection signals generated by the injection signal generator 8 are input through terminals P1d, P2d, P3d, and P4d to the input side of a delay element two stages before each of the delay elements D1d to D4d. For example, in the delay element D2d illustrated in FIG. 12, the injection signal CLK is input to the terminal P2d connected to the gate of the transistor Tr6c provided on the side of input from the delay element D4d two stages before the delay element D2d.

The bias voltage Vbc generated by the bias generator 7 is input through terminals P1c, P2c, P3c, and P4c to the sides of input from the delay elements one stage before the delay elements D1d to D4d. For example, in the delay element D2d illustrated in FIG. 12, the bias voltage Vbc is applied to the terminal P2c connected to the gate of the transistor Tr3c provided on the side of input from the delay element D1d one stage before the delay element D2d.

With such the oscillator circuit 1d, advantages similar to those with the oscillator circuit is of the second embodiment are obtained, and since the delay elements D1d to D4d have circuit configurations as illustrated in FIG. 12 and the replica bias circuit 6 is provided, advantages as described above are also obtained. For example, the output common level may be maintained even if the total amount of bias currents is changed, and thus occurrence of a situation in which changing the output common level leads to the fact that the oscillator circuit does not operate may be suppressed. Furthermore, advantages as described below are obtained.

Figure 14:
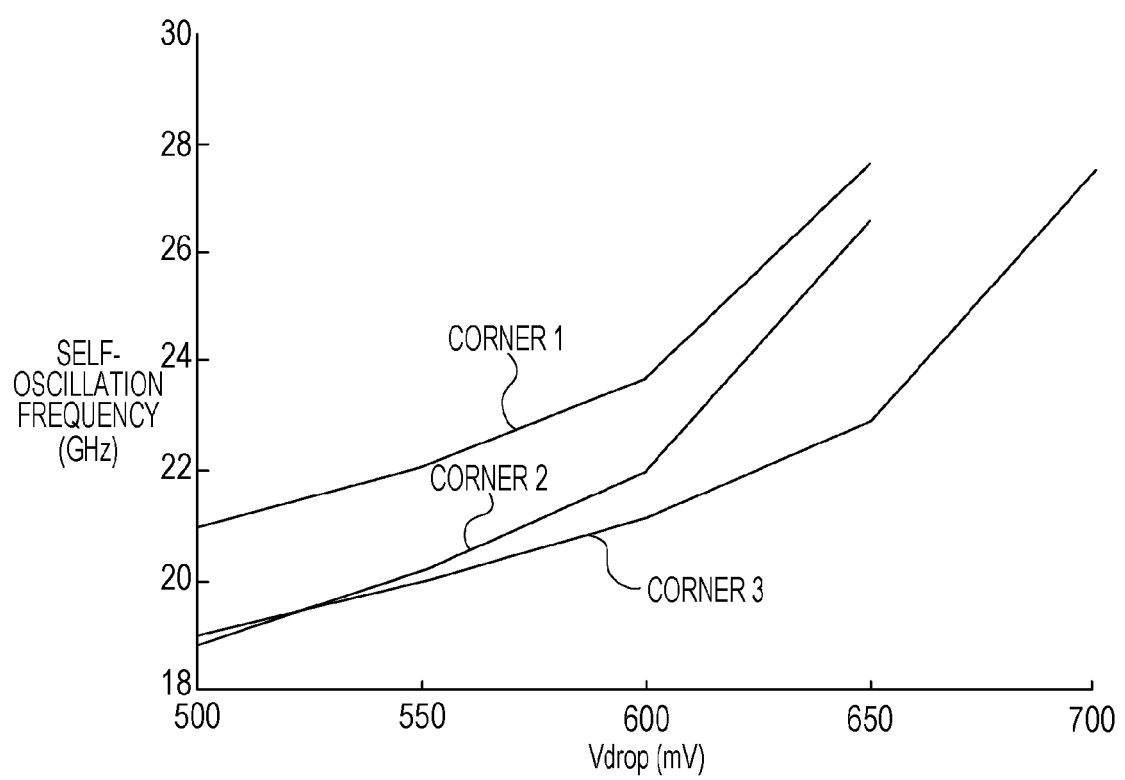
FIG. 14 is a diagram illustrating an example of a simulation result for the dependence of the relationship between the self-oscillation frequency and the voltage Vdrop of the oscillator circuit of the third embodiment on process variations.

FIG. 14 is a diagram illustrating an example of a simulation result for the dependence of the relationship between the self-oscillation frequency and the voltage Vdrop of the oscillator circuit of the third embodiment on process variations. The horizontal axis represents the voltage Vdrop (mV) input to the operational amplifier amp, and the vertical axis represents the self-oscillation frequency (GHz) of the oscillator circuit 1d. In FIG. 14, the relationship between the voltage Vdrop and the self-oscillation frequency under three corner conditions (corner 1, corner 2, and corner 3) caused by process variations is illustrated.

In the oscillator circuit 1d, if process variations occur, the self-oscillation frequency may be adjusted in a relatively large range by adjusting the voltage Vdrop (output common level), and thus the oscillation frequency that may be guaranteed may be wider than that in the oscillation circuit 1 of the first embodiment.

The oscillator circuits 1, 1c, and 1d of the first to third embodiments as described above are, for example, clock data recovery circuits and are applicable to an eye monitor at the time of sampling of received signals.

Figure 15:
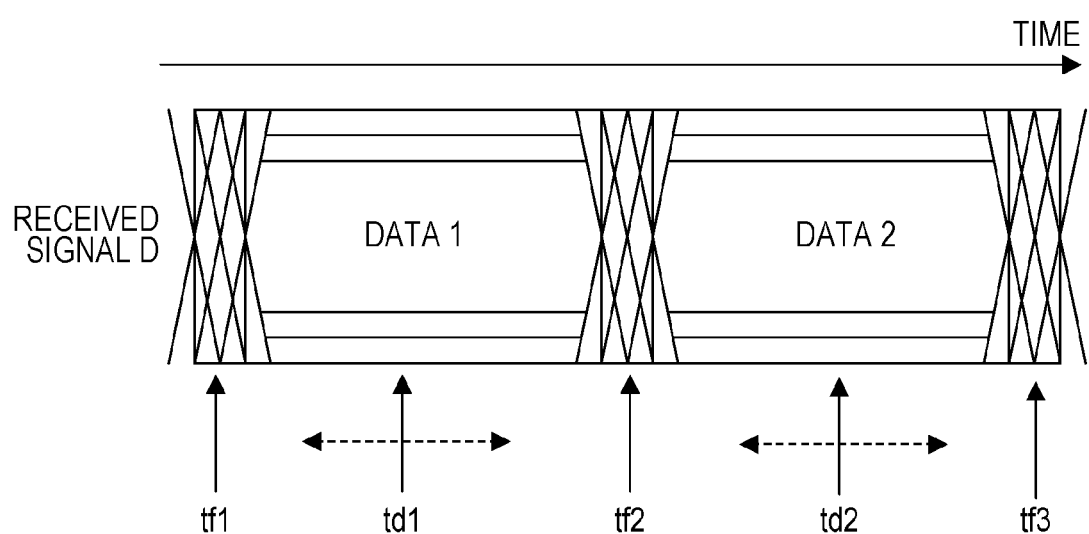
FIG. 15 is a diagram illustrating an operation example of an eye monitor.

FIG. 15 is a diagram illustrating an operation example of an eye monitor. Sampling timings of a received signal D are timings tf1, tf2, and tf3 at which the transition points of data (data 1 and data 2) are captured, and timings td1 and td2 at which data is sampled. After equalization processing, the largest amplitude is not obtained at the center of data in some cases. To address this, using a function called an eye monitor, the phases of clocks for data sampling are adjusted, and an optimum sampling timing is searched for.

For the oscillator signals (for example, clock signals) φ0 to φ7 output from the oscillator circuits 1, 1c, and 1d, the phases may be adjusted in accordance with a plurality of bias voltages. This makes it possible to accurately set suitable sampling timings.

In accordance with the embodiments, one aspect of the oscillator circuit of this disclosure has been described above; however, these embodiments are merely exemplary and the oscillator circuit of this disclosure is not limited to the above description. For example, in the foregoing examples, the delay elements perform differential inputs and differential outputs; however, an inverter circuit that performs one input and one output may be employed. In this case, in order to implement oscillation operations, delay elements will be provided in odd stages.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An oscillator circuit comprising:
   a plurality of delay elements, a first delay element of the plurality of delay elements configured to receive a first oscillator signal outputted from a second delay element of the plurality of delay elements, the second delay element being one stage before the first delay element, and to receive a second oscillator signal outputted from a third delay element of the plurality of delay elements, the third delay element being two or more stages before the first delay element, the plurality of delay elements being connected in a ring, and the first oscillator signal and the second oscillator signal having phases different from one another;

a bias voltage generator configured to change a ratio of a first input bias current for the first oscillator signal to a second input bias current for the second oscillator signal, in accordance with a first bias voltage and a second bias voltage supplied to the plurality of delay elements; and a replica bias circuit configured to cause an output common level of the first delay element to be maintained when the first input bias current and the second input bias current are changed.

2. The oscillator circuit according to claim 1, further comprising:

an injection signal generator configured to generate an injection signal to be supplied to the plurality of delay elements, the injection signal being supplied to the second oscillator signal.

3. The oscillator circuit according to claim 1, wherein the first delay element includes a transistor connected between a power source and an output terminal, and the replica bias circuit includes an operational amplifier configured to adjust a gate voltage of the transistor in accordance with the first input bias current and the second input bias current so as to cause the output common level to be maintained.

* * * * *